(12) United States Patent
Montrose (10) Patent No.: US 6,611,146 B2
(45) Date of Patent: Aug. 26, 2003

(54) STRESS TESTING FOR SEMICONDUCTOR DEVICES

(75) Inventor: Charles J. Montrose, Clintondale, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/894,335

(22) Filed: Jun. 28, 2001

(65) Prior Publication Data
US 2003/0001585 A1 Jan. 2, 2003

(51) Int. Cl.[7] ............................................. G01R 31/08
(52) U.S. Cl. ...................................................... 324/519
(58) Field of Search ................................ 324/519, 759, 324/763, 765; 327/309, 318; 365/185.04, 200

(56) References Cited

U.S. PATENT DOCUMENTS 3,552,368 A * 1/1971 Hunter ........................ 123/148
3,640,120 A * 2/1972 Nihof et al. .................... 73/53
5,686,820 A * 11/1997 Riggio ........................ 323/273
6,262,585 B1 * 7/2001 Frodsham .................... 324/763

* cited by examiner

Primary Examiner—Safet Metjahic
Assistant Examiner—Etienne P LeRoux
(74) Attorney, Agent, or Firm—Tiffany L. Townsend (57) ABSTRACT

An apparatus for applying a stress voltage to a device under test includes a stress voltage source, a constant voltage circuit having an input connected to the stress voltage source and an output connected to a control circuit for removing stress when current exceeds a predetermined level which is connected to the device under test. The constant voltage circuit provides a constant stress voltage to the device under test. A monitoring circuit measures the stress voltage applied to the device under test, and measures leakage current through the device under test. A switch has inputs connected to outputs of the monitoring circuit, with the switch being capable of sending a selected output or outputs of the monitoring circuit to a measurement system.

7 Claims, 8 Drawing Sheets

STRESS TESTING FOR SEMICONDUCTOR DEVICES

BACKGROUND OF THE INVENTION

The invention relates to electrical stress testing and, more particularly, to stress testing of semiconductor devices.

During the manufacture of semiconductor devices, various types of defects and failures may occur. A failure occurs when a semiconductor device fails to meet its design specifications. A defect occurs when a semiconductor device has an improper structure which may result in an immediate failure of the device, or the device may have the potential to fail during its expected lifetime. For example, due to a manufacturing error, a semiconductor device having a structure such as a metal-insulator-metal (MIM) capacitor may have a latent defect such as thinned electrodes or tiny holes within the insulating material. As a result, the device might sustain a short, a decreased capacitance, or break down over a period of time.

Testing is performed on semiconductor devices in order to locate defects and failures in such devices. Specifically, various populations of devices, such as MIM capacitors, may be subjected to controlled stress test conditions as part of a quality and reliability assurance program for commercial use. During these stress tests, one or more MIM capacitors are typically subjected to a stress test voltage for a predetermined amount of time and at a predetermined temperature. Measurements of stress leakage currents and other parameters are taken to determine breakdown and failure conditions of the devices.

Stress driver circuits are typically used to apply a stress test voltage to the element or elements under test. An input test voltage is applied across buffer circuit elements, such as precision limiting resistors and readback sense circuits which provide information on actual applied voltage and leakage currents. The buffer elements, in turn, are connected to the elements under test. The test voltage is increased or adjusted until the voltage directly across the element(s) under test is precisely equal to the desired stress test voltage. Because resistors and other current carrying elements are used in the test circuitry, however, the voltage across the elements under test is often less than the input test voltage due to a voltage drop as leakage currents are passed through resistive elements. In addition, stress voltages simultaneously applied across a number of test elements may vary from element to element. Without a precise application of test parameters such as stress voltage, it becomes more difficult to fully understand the failure modes of devices subjected to stress conditions.

It is desirable, therefore, to provide a stress testing method and/or apparatus which addresses the abovementioned concerns.

BRIEF SUMMARY OF THE INVENTION

In an exemplary first embodiment of the invention, an apparatus for applying a stress voltage to a device under test includes a stress voltage source, a constant voltage circuit having an input connected to the stress voltage source and an output connected to the device under test. The constant voltage circuit provides a constant stress voltage to the device under test. There is also a control circuit which removes this voltage when the induced leakage current exceeds a predetermined level. A monitoring circuit measures the stress voltage applied to the device under test, and measures leakage current through the device under test. A switch has inputs connected to outputs of the monitoring circuit, with the switch being capable of sending a selected output or outputs of the monitoring circuit to a measurement system. Preferably, the constant voltage circuit is capable of providing a constant voltage source greater than 15 volts.

BRIEF DESCRIPTION OF THE DRAWINGS

Add Preample

DETAILED DESCRIPTION OF THE PREFERRED EMBODIMENT

Figure 1:
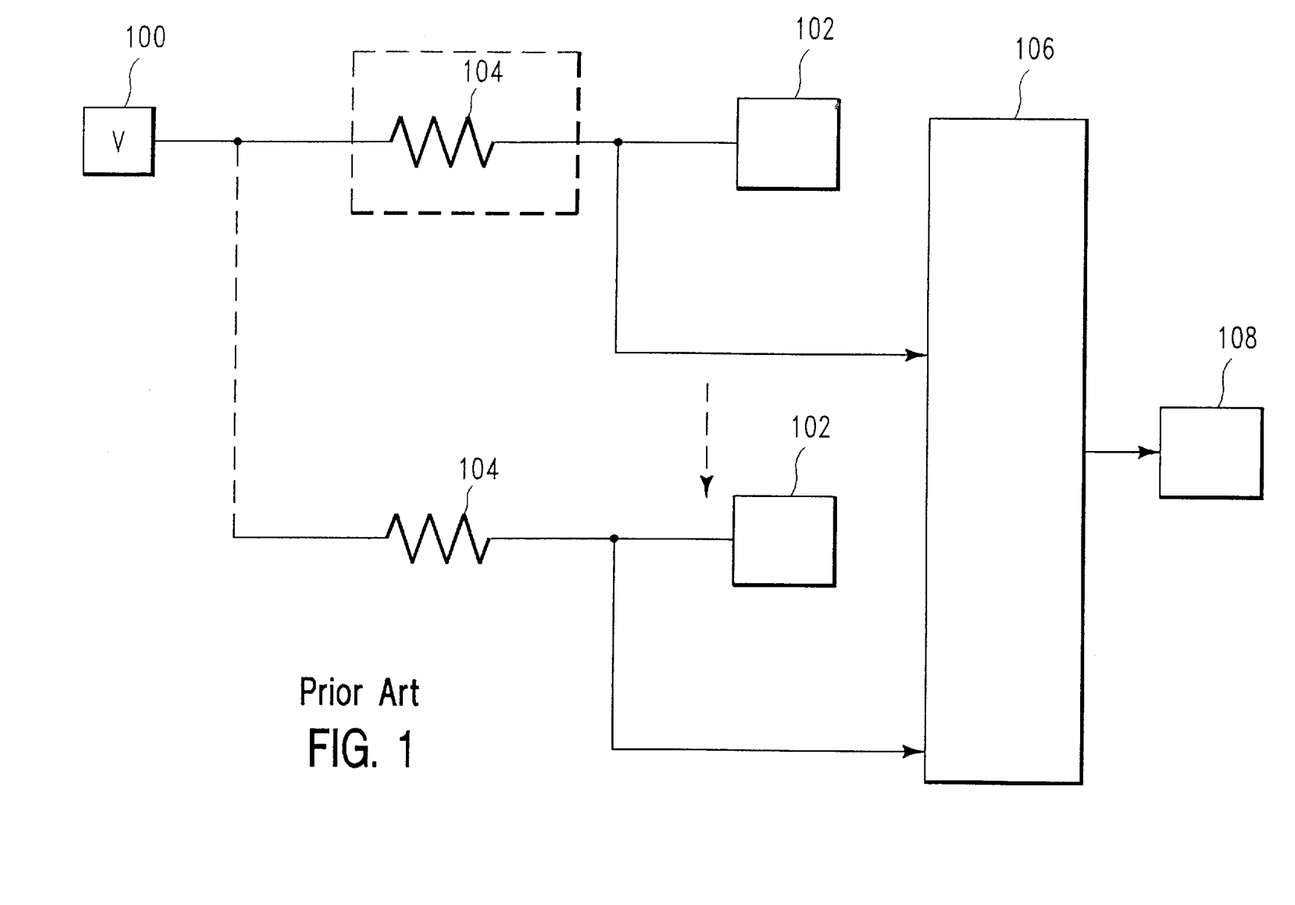
FIG. 1 is a block diagram of a known system of applying a stress test voltage to a series of test devices.

Referring initially to FIG. 1, a known system of applying a stress test voltage to a test device is shown. A stress voltage source 100 (typically a variable voltage source) is applied to a test device 102 or series of devices, such as MIM capacitors. The value of the stress voltage is adjusted until the desired voltage across the test devices 102 is achieved. In order to limit leakage or short circuit current passing through the test devices 102, precision resistors 104 are connected between the stress voltage source 100 and each individual test device 102. Stress currents passing through test devices 102 due to the application of stress voltage source 100 may be monitored or scanned one at a time by a scanning device 106, which may include electromechanical relays (not shown). The scanning device 106 selectively passes the stress voltage and leakage current information from each test device 102 on to a remote measurement system 108, which may include a computer controlled voltmeter (not shown).

One problem associated with the above approach stems from the application of resistors 104. Because there is a voltage drop across resistors 104 upon the onset of stress or leakage current passing through test devices 102, the voltage measured directly at the test devices is no longer equal to the stress voltage value. Over time, the test devices will begin to break down and conduct short circuit current, thereby increasing the voltage drop across resistors 104. It will be appreciated that such a condition will result not only in decreased stress voltages applied to the test devices, but also varying and inconsistent stress voltages applied to each individual test device 102. Without a constant source of stress voltage 100, uniformly applied to each test device 102, a proper analysis of the stress characteristics of the test devices 102 is difficult to perform.

Figure 2:
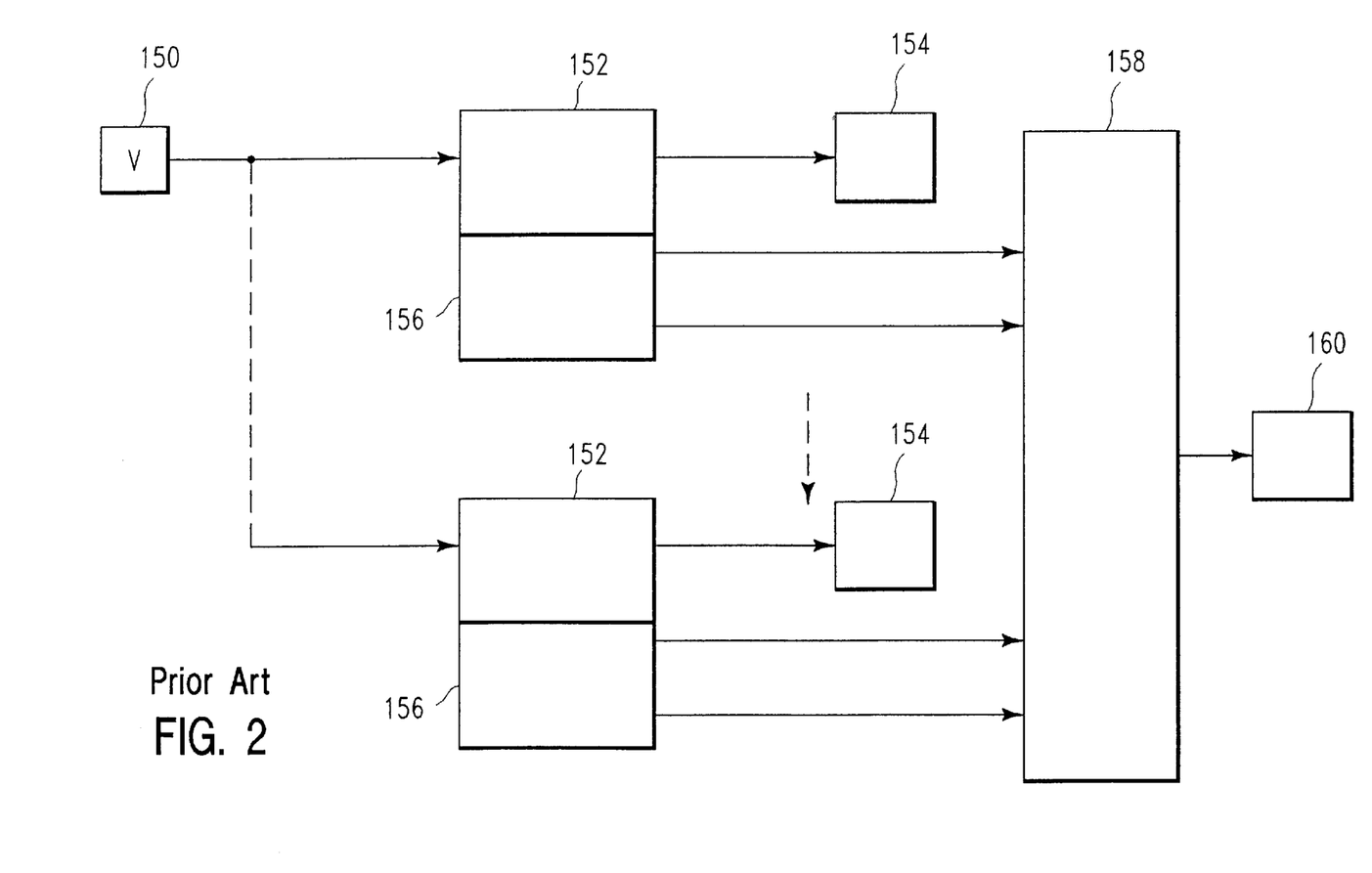
FIG. 2 is a block diagram of another known system of applying a stress test voltage to a series of test devices.

FIG. 2 is a block diagram of a constant voltage stressing system for test components, also known in the art. A stress voltage source 150 is inputted to a series of constant voltage drivers 152, which provide a constant voltage output to a corresponding series of test devices 154. The constant voltage drivers 152 typically include an instrumentation grade operational amplifier "op-amp" (not shown) with a precision resistor (not shown) in series with the output of the op-amp for current sensing and current limiting. The constant voltage drivers 152 hold the applied stress voltages at the test devices 154 constant and provide a buffer from the stress voltage source 150. Readback sense circuits 156 are also used to provide an accurate measurement of both the voltage applied at the test devices 154 and any leakage or stress current passing therethrough. These measurements are then typically sent to a solid state multiplexing device 158, which selectively passes a measurement to a remote measuring system 160.

Although the system shown in FIG. 2 provides a constant stress test voltage to a device, the stress testing voltage range is generally limited by the operating supply voltage of the test circuitry. This is typically on the order of ±15 volts or less, meaning that the voltage driving, sensing and multiplexing functions are performed at ±10 volts or less. However, certain semiconductor devices, such as MIM capacitors, require stress test voltages in excess of 30 volts. As such, the prior art systems are inadequate for stress testing of higher voltage toleranced components.

Figure 3:
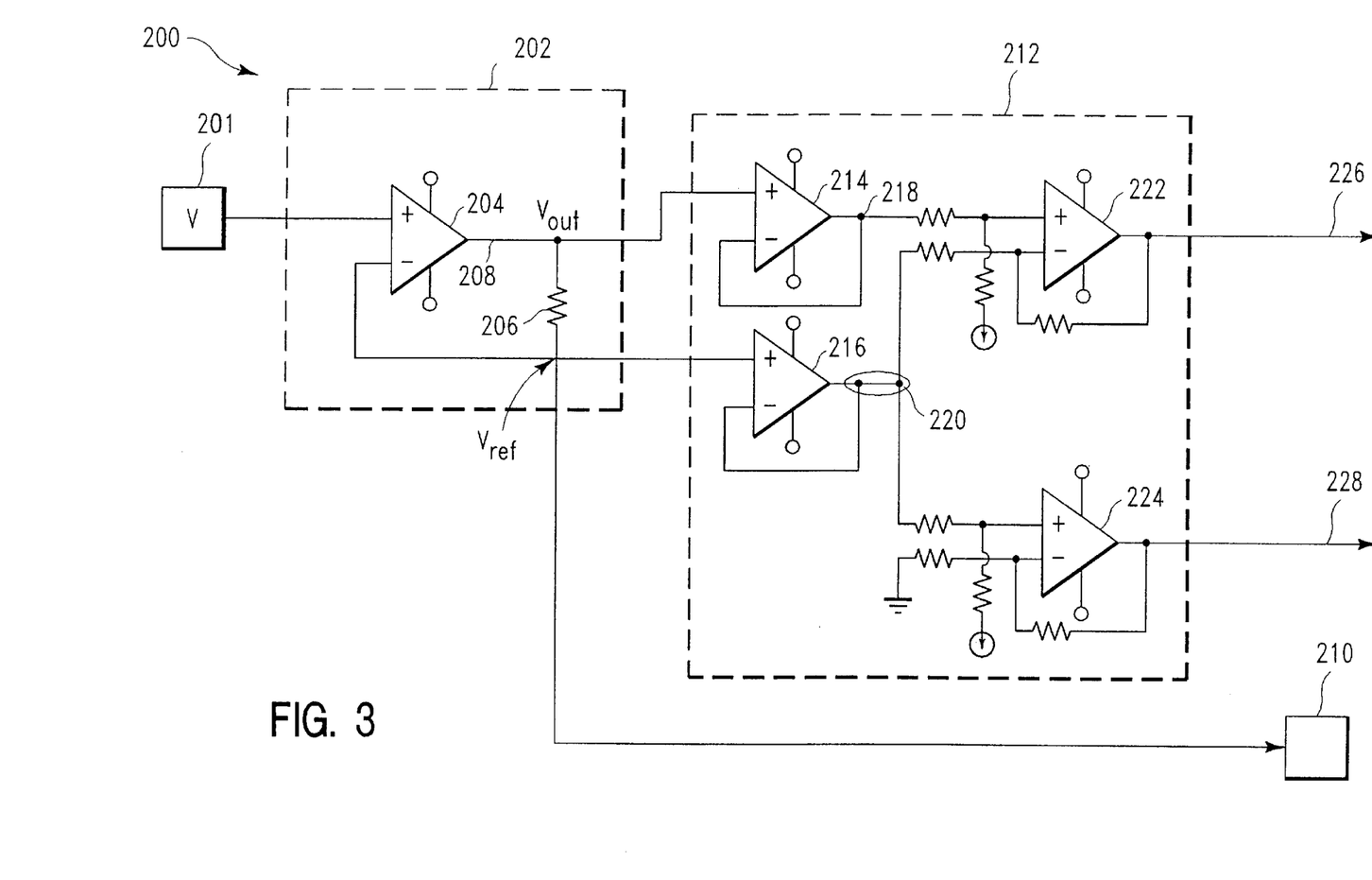
FIG. 3 is a schematic diagram of a constant voltage circuit and monitoring circuit, in accordance with a first embodiment of the present invention.

Referring now to FIG. 3, an apparatus 200 for stress testing semiconductor devices in accordance with a first embodiment of the invention is shown. A stress voltage source 201 is connected to a constant voltage circuit 202, which includes a first operational amplifier 204 (op-amp) and a resistor 206 in series with the output 208 of first op-amp 204. First op-amp 204 is preferably a high input impedance, high voltage FET-input operational amplifier, such as component number OPA445, manufactured by Burr-Brown Corporation. As shown in FIG. 3, the stress voltage source 201 is connected to the non-inverting (+) terminal of first op-amp 204. The inverting (−) terminal of first op-amp 204 is connected to the output 208 through resistor 206. Thus configured, first op-amp 204 provides a constant voltage output $V_{out}$ for application to a test device 210. It will be noted that if a stress leakage current is passed through resistor 206, a voltage drop will result across resistor 206 as $V_{out}$ rises. $V_{test}$ remains constant due to the feedback into the inverting (−) terminal of first op-amp 204. This first embodiment is best utilized where the voltage associated with the input (and therefore output) of operational amplifier 204 does not approach the saturation voltage for the operational amplifier ($V_{sat}$). Where the $V_{test}$ approaches $V_{sat}$, a small amount of current flow through the test device, 210, will result in a drop in $V_{test}$ because $V_{out}$ cannot rise to a voltage greater than $V_{sat}$.

In a typical application, first op-amp 204 is configured to operate with a power supply at ±45 volts, having corresponding input voltages ranging from −40 to +40 volts. In the first embodiment, however, the power supply voltages for first op-amp are shifted to +85 volts and −5 volts, thereby accommodating a range of input stress voltages from 0 to 80 volts.

In addition to constant voltage circuit 202, a "readback", or monitoring circuit 212 is also provided for monitoring the value of the actual applied stress voltage $V_{test}$, as well as the value of the leakage current drawn by test device 210. As can be seen in FIG. 3, monitoring circuit 212 includes a second op-amp 214 and a third op-amp 216, both of which are configured as voltage followers by having their respective outputs connected directly to the non-inverting (−) terminals thereof. The output 218 of the second op-amp 214 is a buffered reproduction of $V_{out}$, just as the output 220 of the third op-amp 216 is a buffered reproduction of $V_{test}$.

A pair of differential amplifiers, fourth op-amp 222 and fifth op-amp 224, generate outputs 226, 228 corresponding to the leakage current through resistor 206 and to the voltage applied to the test device $V_{test}$, respectively. As shown in FIG. 3, fourth op-amp 222 has its non-inverting terminal (+) connected to output 218 of second op amp 214, which is the buffered reproduction of $V_{out}$. The inverting terminal (−) of fourth op-amp 214 is connected to output 220 of third op-amp 216, which is the buffered reproduction of $V_{test}$. A network of equally valued 60 kÙ, precision resistors are used to adjust the gain of fourth op-amp 222 such that its output 226 represents the difference between $V_{out}$ and $V_{test}$, amplified at unity gain. It should be understood that other resistance values may be used in conjunction with fourth op-amp 222. Thus, it can be seen that if test device 210 begins to pass a leakage current through resistor 206, the voltage drop across resistor 206 will result in a difference between $V_{out}$ and $V_{test}$, reflected at output 226. Output 226, in turn can be used to determine the value of the leakage current through resistor 206, depending on the value of resistor 206.

Fifth op-amp 224 is also used as a differential amplifier. The non-inverting (+) terminal thereof is connected to output 220 of third op-amp which, again, is the buffered reproduction of $V_{test}$. The inverting(−) terminal of fifth op-amp 224 is connected to ground. As is the case with fourth op-amp 222, a network of equally valued 60 kÙ, precision resistors is also used to adjust the gain of fifth op-amp 224 such that its output 226 represents the difference between $V_{test}$ and ground, amplified at unity gain. Again, it is understood that other resistance values may be used. Output 228, therefore represents the value of $V_{test}$, the voltage actually applied to test device 210.

A series of high input impedance, constant voltage circuits 202 may be combined with a series of monitoring circuits 212 to apply stress test voltage 201 to a series of corresponding test devices 210. For each device tested, there will be three outputs generated. First, the test voltage $V_{test}$ is generated by constant voltage circuit 202, adjusted to its desired value, and then applied to the device under test. Second, output 226 represents the amount of leakage current drawn by device 210 through resistor 206. Third, output 228 represents the actual value of $V_{test}$. Outputs 226 and 228 may then be multiplexed and sent to a measurement system, as described hereinafter. It should also be noted that the power supplies of each op-amp shown in FIG. 3 are shifted to +85 volts and −5 volts, for the reasons indicated above.

Figures 4, 4A:
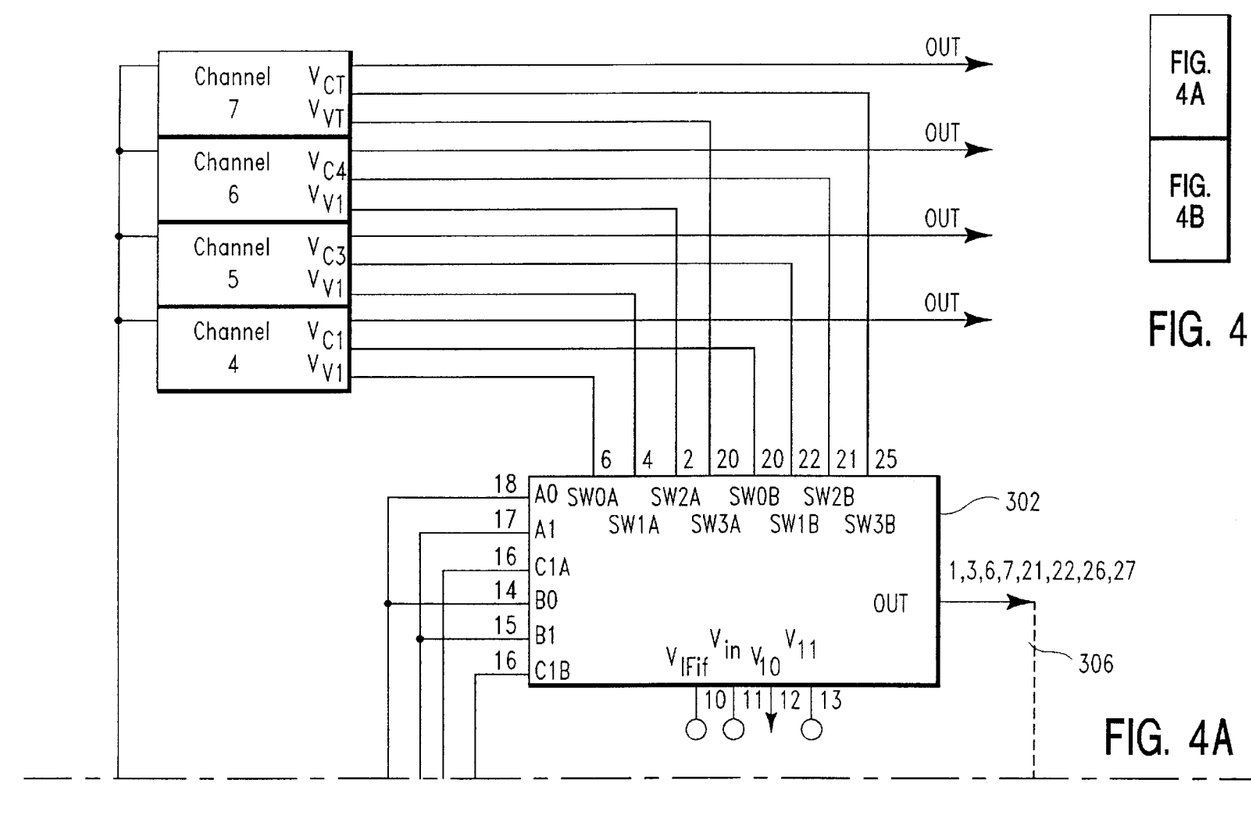
FIG. 4 is a schematic diagram of a multiplexing operation performed by a first embodiment of the present invention.
Figure 4B:
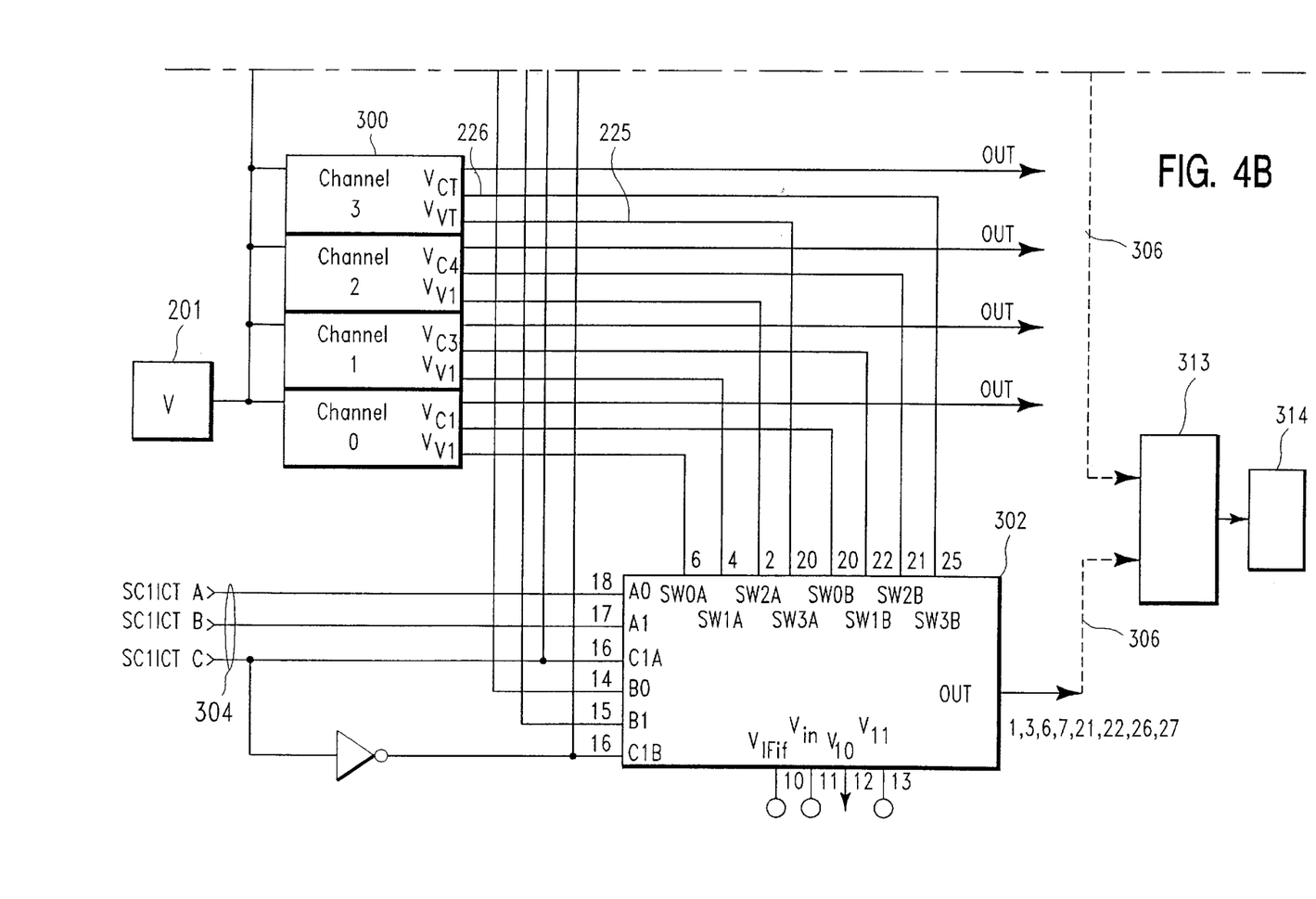

Referring now to FIG. 4, a first embodiment of the invention is shown wherein eight channels 300 (numbered 0 through 7) each represent a combination of the constant voltage circuit 202 and the monitoring circuit 212. Stress voltage source 201 is applied as an input to each channel 300 which, as described above, provides three outputs: the test voltage $V_{test}$ and outputs 226 and 228.

As mentioned previously, outputs 226 and 228 (representing the leakage current through a selected test device 210 and the applied voltage to the device 210) may be sent to a multiplexing device for selective input to a remote measurement system. In the present embodiment, a pair of dual high voltage analog switches 302 are used to perform the multiplexing function on outputs 226 and 228 for each channel 300. Analog switch 302 is preferably a dual, 1 of 4 high voltage analog switch, such as component number HV20720, manufactured by Supertex, Inc. While each switch 302 is normally configured to provide a pair of (1 to 4) multiplexed outputs, it may be configured to provide a single (1 of 8) multiplexed output. In the first embodiment shown in FIG. 4, each analog switch 300 receives input from four separate channels 300, with each channel 300 providing two inputs 226, 228 thereto. Further, each analog switch 300 has three digital control inputs 304 which control the selected output 306.

Figures 5, 6:
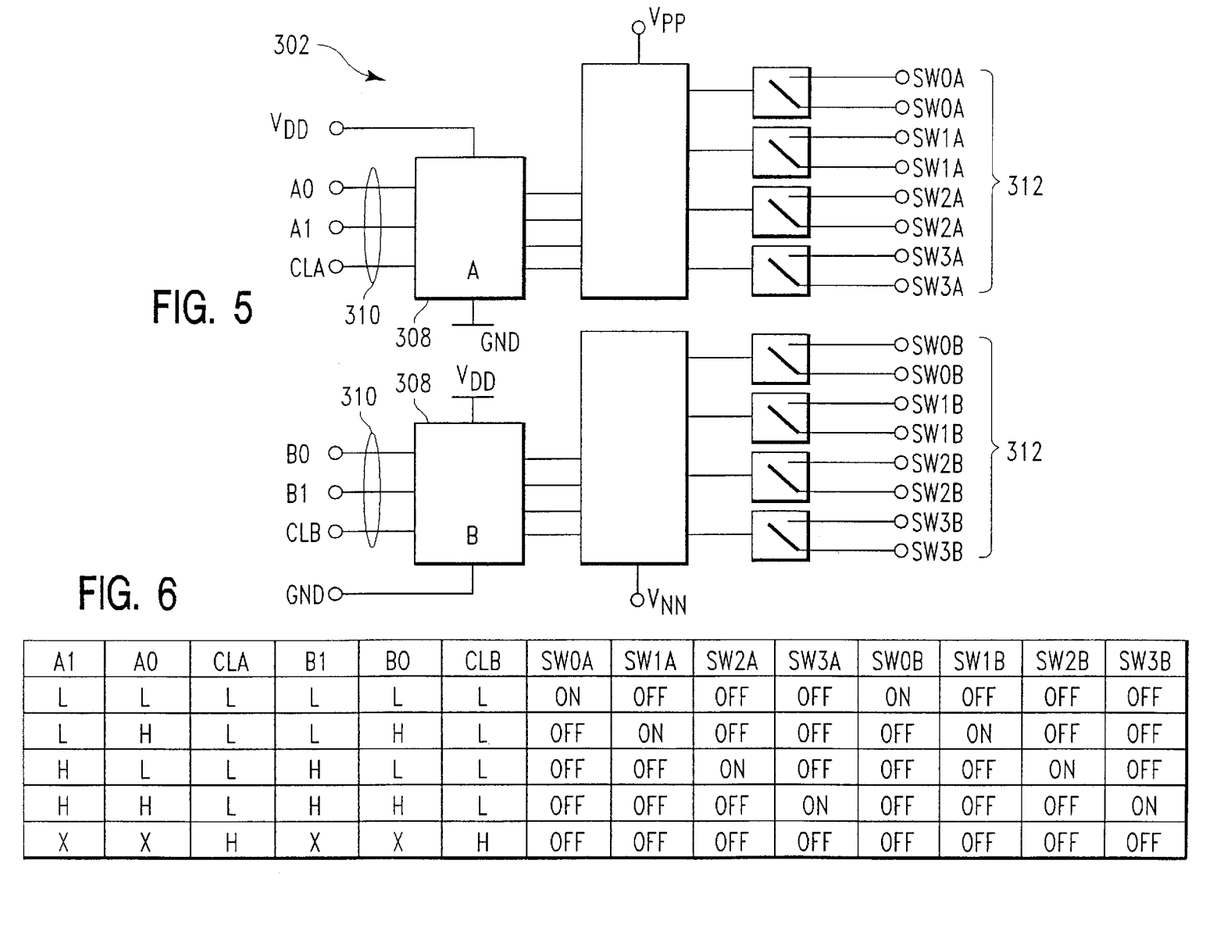
FIG. 5 is a operational block diagram of the analog switches depicted in FIG. 4.
FIG. 6 is a truth table which illustrates the logical operation of the analog switches depicted in FIG. 4.

FIG. 5 illustrates the multiplexing function of an individual analog switch 302. Switch 302 has dual 1 to 4 decoders 308, designated "A" and "B", each of which are operated by three logic bit input pins 310 (designated by A0, A1, CLA and B0, B1, CLB, respectively). Correspondingly, each decoder has a set of four analog output switches 312, designated by SW0A through SW3A and SW0B through SW3B. As shown in the truth table of FIG. 6, the switch 302 is normally designed such that for each decoder 308, only one of the four output switches 312 can be closed at a given time. However, if the "clear" bit (CLA or CLB) is high, then all four switches will remain open. Thus, it can be seen how both decoders in a given switch 302 can be made to work together to form a single 1 to 8 decoder. By providing inverted inputs to CLA and CLB (FIG. 4), only one set (A or B) of output switches 312 may be activated at a given time.

The power supplied to the analog switches at $V_{pp}$ and $V_{nn}$ shown in FIG. 5, is preferably set at +95 V and −48 V, respectively, for compatibility with the constant voltage and monitoring circuits 202, 212 of channels 300.

Referring once again to FIG. 4, it can be seen that for each set of four channels 300 used in the stress testing process, an analog switch 302 wired in an 8 to 1 multiplexer configuration is used. Therefore, when multiple corresponding multiplexed outputs 306 exist, additional levels of multiplexing 313 may be used as required. It will be appreciated that the aforementioned first embodiment may be repeated as often as necessary until the desired number of selected outputs are sent to a remote measurement system 314. Measurement system 314 may be, for example, a computer controlled voltmeter.

As introduced supra, the first embodiment as described operates best where the Vtest does not approach or exceed Vsat However, where Vtest does approach Vsat the use of the first embodiment is limited as the circuit as described will not allow a constant voltage stress to continue beyond a small amount of leakage current through the test device. This limitation becomes more significant when devices such as MIM (metal insulator metal) capacitors need to be tested and stressed, because this is performed at higher voltages.

Figure 7:
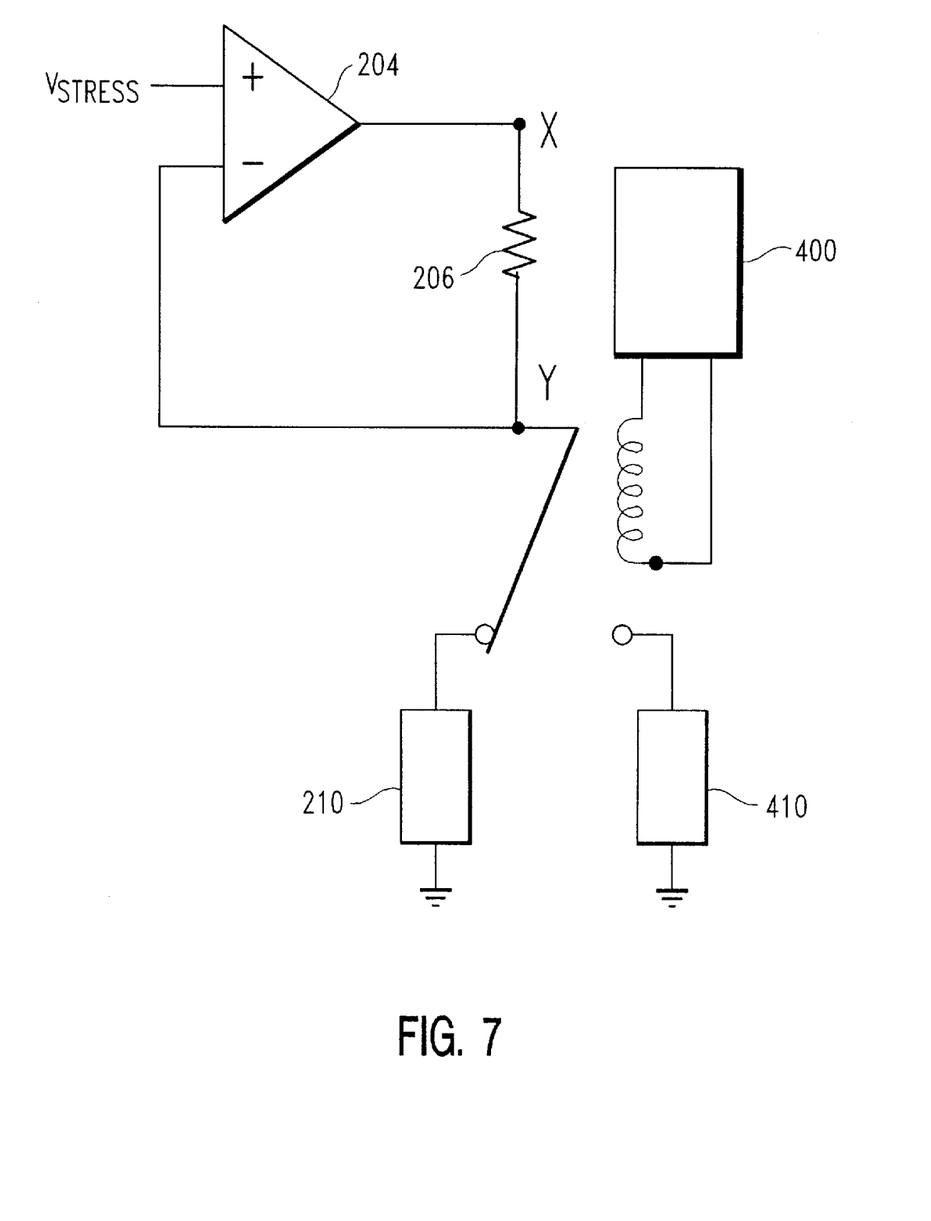
FIG. 7 is a block diagram of the second embodiment of the instant invention.

These conditions exist because the resistor 206 in FIG. 3 and FIG. 7 is used to accomplish two ends, first to sense the current flowing through the test device and second to limit the current flowing through the test device. Resistor 206 is usually a precision resistor that is used to sense the load current. Any current flowing into the inverting input of the operational amplifier is orders of magnitude lower than that of the current flowing through the load and may be ignored. Therefore it may be assumed that all of the load current lows through resistor, $R_{sense}$, 206. The voltage drop across $R_{sense}$ can be measured and the load current calculated by dividing this voltage by the known sense resistance:

$$I_{load} = V_{Rsense}/R_{sense}$$

$R_{sense}$ is also used to limit the load current in the event that the load should short. In this case, the operational amplifier will saturate and its output will go as high as $V_{sat}$, while the voltage at the test device will go to zero. The short circuit current is calculated as:

$$I_{short} = V_{sat}/R_{sense}$$

There is a third implication to the value chosen for $R_{sense}$. The driver circuit shown in FIG. 3 is intended to be a constant voltage driver. There is a limitation to the amount of current the driver can provide, while still being expected to maintain a constant voltage ($V_{test}$) at the test device. As the test device begins to leak (the test device current rises) $V_{test}$ at the test device is kept constant by feedback and $V_{out}$ rises until it reaches $V_{sat}$ (saturation). Any increase in the test device leakage current beyond this point will cause the stress voltage at the test device to drop. This limiting condition can be expressed as follows:

$$I_{constant\ voltage} = (V_{sat} - V_{test})/R_{sense}$$

In order to allow a usable value for $I_{constant\ voltage}$, the equation above shows that $R_{sense}$ must be reduced. Keeping the same design, if the $R_{sense}$ is reduced then the maximum leakage current $I_{short}$ would also rise. This higher allowable short circuit current could add cost and complexity to stress systems and would allow greater amounts of damage to potentially be caused to the stressed device. One would like to keep $I_{constant\ voltage}$ high and $I_{short}$ low. These are conflicting design considerations.

The design conflicts identified above are solved by the second embodiment of the invention where the sense resistor for the test device is used for current sensing only. A different mechanism is used for current limiting as shown in FIG. 7. In FIG. 7, the function of leakage current limiting is performed by the control circuit, 400. The control circuit senses the voltage across the sense resistor (between points X and Y) and controls a relay which switches the load on the driver from the test device, 210, to a dummy load, 410 when a predetermined value of leakage current has been exceeded. Current is thereby removed from the load when it reaches a predetermined maximum value and the current drawn through the test device is limited. Since the current is removed at a predetermined value and not just limited, the test device is not exposed to excessive current loads and will not be physically degraded and can undergo physical failure analysis. The dummy load should be configured such that it draws at least enough current to keep in the "tripped" state, insuring that the test device stays off line until the stress voltage is removed, at which point it may automatically reset itself. If desirable for the tester, the reference voltage generator may be capable of varying the reference voltage. This would allow control of the maximum current allowed to flow through the device for each individual test.

Figure 8:
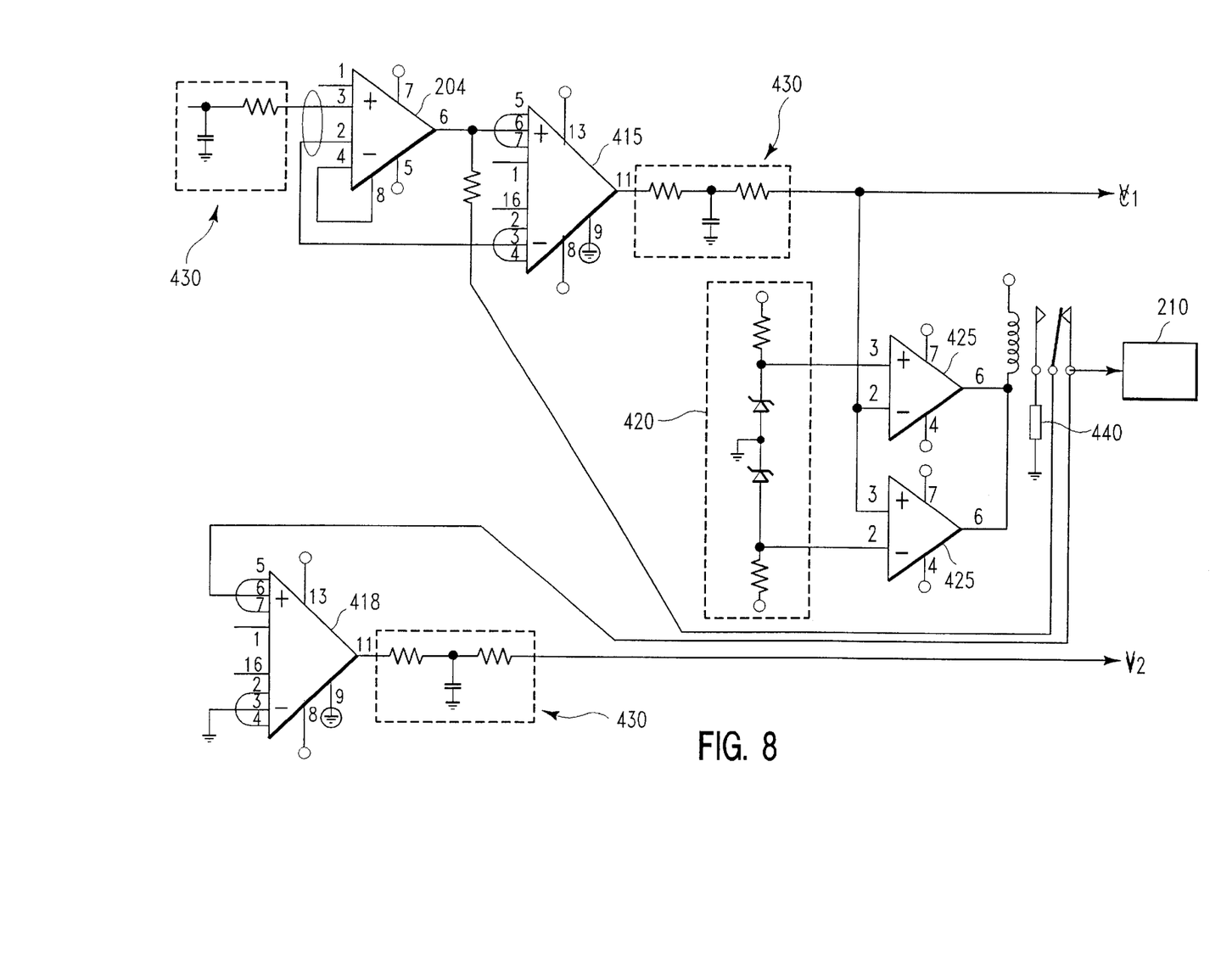
FIG. 8 is a schematic diagram of a constant voltage circuit and monitoring circuit, in accordance with a second embodiment of the instant invention.

An example of a control circuit is given in FIG. 8. As shown in FIG. 8, the output of operational amplifier, 204, of FIG. 3 is connected to monitoring circuitry, 415, 418, in this embodiment. The exemplary control circuitry includes a reference voltage generator, 420, which determines the maximum current load that can occur before tripping the relay. The outputs of the voltage generator, 420, are compared by comparators, 425, and the result will cause the tripping of the relay when the current exceeds the predetermined value and the dummy load, 440, will receive the current. The voltage to the test device, 210, will be zero when the predetermined value is exceeded. In the instant example the dummy load, 440, consist of a resistor of sufficient ohmage to ensure that the test device, 210, remains off line.

The layout of the second embodiment lends itself to multiplexer of FIGS. 4–6. The output of the monitoring circuit 415 in FIG. 8 is analogous to the output of the monitoring circuit in FIG. 3 at point 226. The output of the monitoring circuit, 418 in FIG. 8 is analogous to the output of the monitoring circuit in FIG. 3 at point 228.

It should be noted that certain filtering elements, 430, may be added to the circuit to achieve the individual designer circuit design. The inventor contemplated this and an example of filters that might be used are included in FIG. 8.

By providing a constant stress voltage source and parameter monitoring capability when stress testing certain high voltage semiconductor components, such as MIM capacitors, the aforementioned drawbacks may be overcome. While the invention has been described with reference to preferred embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An apparatus for applying a stress voltage to a device under test, comprising:
   a device under test having at least two channels;
   a stress voltage source;
   a constant voltage circuit providing a constant stress voltage to each of the at least two channels of the devices under test simultaneously;
   a monitoring circuit which measures each of the at least two stress voltages applied to the device under test, said monitoring circuit further measuring leakage current through each of the at least two channels of the device under test;
   a control circuit which selectively removes the voltage supplied by the constant voltage circuit when the corresponding channel current is at least about a predetermined value, the control circuit having at least one input, the input connected to the monitoring circuit; and
   a switch having inputs connected to the outputs of said monitoring circuit, said switch capable of sending at least one selected output of said monitoring circuit to a measurement system;
   wherein said constant voltage circuit has a first input connected to said stress voltage source and an output connected of one of the inputs of said control circuit, said constant voltage circuit capable of providing a constant voltage to each of the at least two channels of greater than 15 volts.

2. The apparatus of claim 1, wherein said constant voltage circuit further comprises an operational amplifier, said operational amplifier having an input connected to said stress voltage source and an output connected to the control circuit.

3. The apparatus of claim 1, wherein said monitoring circuit further comprises:
   a pair of differential amplifiers, one of said differential amplifiers having an output representing said leakage current through the device under test; and
   the other of said differential amplifiers having an output representing said stress voltage applied to the device under test.

4. The apparatus of claim 1 wherein said control circuit further comprises:
   a reference voltage generator and at least two comparators.

5. The apparatus according to claim 4 wherein the range of the reference voltage generator can be adjusted.

6. The apparatus according to claim 1 wherein the apparatus further comprises at least one filter.

7. The apparatus according to claim 6 wherein the input and the output of the constant voltage circuit and output of the second of said pair of said differential amplifiers are connected to filters.

* * * * *